United States Patent
Nasiri et al.

(10) Patent No.: US 6,255,728 B1
(45) Date of Patent: Jul. 3, 2001

(54) RIGID ENCAPSULATION PACKAGE FOR SEMICONDUCTOR DEVICES

(75) Inventors: Steven S. Nasiri, Saratoga; David W. Burns, San Jose; Janusz Bryzek, Fremont, all of CA (US)

(73) Assignee: Maxim Integrated Products, Inc., Sunnyvale, CA (US)

( * ) Notice: Subject to any disclaimer, the term of this patent is extended or adjusted under 35 U.S.C. 154(b) by 0 days.

(21) Appl. No.: 09/232,801

(22) Filed: Jan. 15, 1999

(51) Int. Cl.$^7$ ............ H01L 23/12; H01L 23/02; H01L 23/495
(52) U.S. Cl. ............ 257/704; 257/678; 257/666; 257/787
(58) Field of Search .................. 257/704, 678, 257/684, 726, 727, 731, 787, 666; 438/106, 121, 125

(56) References Cited

U.S. PATENT DOCUMENTS

| | | | |
|---|---|---|---|
| 3,247,719 | 4/1966 | Chelner | 73/726 |
| 3,328,649 | 6/1967 | Rindner et al. | 257/418 |
| 3,739,315 | 6/1973 | Kurtz et al. | 338/3 |
| 4,019,388 | 4/1977 | Hall, II et al. | 73/754 |
| 4,040,297 | 8/1977 | Karsmakers et al. | 73/725 |
| 4,050,049 | 9/1977 | Youmans | 338/47 |
| 4,125,820 | 11/1978 | Marshall | 338/4 |
| 4,129,042 | 12/1978 | Rosvold | 73/727 |
| 4,236,137 | 11/1980 | Kurtz et al. | 338/4 |
| 4,241,325 | 12/1980 | Di Giovanni | 338/4 |
| 4,276,533 | 6/1981 | Tominaga et al. | 338/4 |
| 4,295,115 | 10/1981 | Takahashi et al. | 338/4 |
| 4,322,980 | 4/1982 | Suzuki et al. | 73/727 |
| 4,399,707 | 8/1983 | Wamstad | 73/727 |
| 4,467,656 | 8/1984 | Mallon et al. | 73/727 |
| 4,502,335 | 3/1985 | Wamstad et al. | 73/721 |
| 4,656,454 | 4/1987 | Rosenberger | 338/2 |
| 4,665,754 | 5/1987 | Glenn et al. | 73/727 |
| 4,737,756 | 4/1988 | Bowman | 338/4 |
| 4,763,098 | 8/1988 | Glenn et al. | 338/4 |
| 4,771,639 | 9/1988 | Saigusa et al. | 73/727 |
| 4,773,269 | 9/1988 | Knecht et al. | 73/706 |
| 4,790,192 | 12/1988 | Knecht et al. | 73/721 |
| 4,800,758 | 1/1989 | Knecht et al. | 73/727 |
| 4,918,992 | 4/1990 | Mathias | 73/727 |
| 4,972,716 | 11/1990 | Tobita et al. | 73/721 |
| 5,029,479 | 7/1991 | Bryan | 73/721 |
| 5,064,165 | 11/1991 | Jerman | 251/61.1 |
| 5,142,912 | 9/1992 | Frische | 73/702 |
| 5,157,972 | 10/1992 | Broden et al. | 73/718 |
| 5,172,205 | 12/1992 | French et al. | 257/414 |
| 5,174,156 | 12/1992 | Johnson et al. | 73/715 |
| 5,177,579 | 1/1993 | Jerman | 73/724 |

(List continued on next page.)

FOREIGN PATENT DOCUMENTS

| | | |
|---|---|---|
| 42 27 893 A1 | 4/1993 | (DE) . |
| 0762096A1 | 3/1997 | (EP) . |
| 7-110277 | 4/1995 | (JP) . |
| WO 96/26424 | 8/1996 | (WO) . |

Primary Examiner—Sheila V. Clark
Assistant Examiner—Jhihan B Clark
(74) Attorney, Agent, or Firm—Blakely, Sokoloff, Taylor & Zafman LLP (57) ABSTRACT

A rigid encapsulation package for semiconductor sensors, actuators, and devices is described. In one embodiment, a semiconductor pressure sensor includes a sensor element having a deformable diaphragm for measurement of pressure, and a cap that includes a recess. The cap is attached to the sensor element to form a cavity therebetween. The pressure sensor further includes a leadframe, interconnecting bond wires, a pressure port that is coupled to the sensor element, and a nominally rigid material formed over the sensor element, cap, leadframe, and bond wires. The material may include one or more of the following: epoxy, RTV, resins, and gel. The sensor element may include a built-in stress isolation flexible region. A second pressure port may optionally be attached to the housing for providing differential or gage pressure measurements.

44 Claims, 6 Drawing Sheets

U.S. PATENT DOCUMENTS

| | | | |
|---|---|---|---|
| 5,178,015 | 1/1993 | Loeppert et al. | 73/718 |
| 5,186,055 | 2/1993 | Kovacich et al. | 73/727 |
| 5,207,102 | 5/1993 | Takahashi et al. | 73/727 |
| 5,209,118 | 5/1993 | Jerman | 73/715 |
| 5,220,835 | 6/1993 | Stephan | 73/517 R |
| 5,225,373 | 7/1993 | Takahashi et al. | 438/51 |
| 5,257,546 | 11/1993 | Tobita et al. | 73/727 |
| 5,459,351 | 10/1995 | Bender | 257/415 |
| 5,465,626 | 11/1995 | Brown et al. | 73/715 |
| 5,477,738 | 12/1995 | Tobita et al. | 73/716 |
| 5,483,834 | 1/1996 | Frick | 73/724 |
| 5,509,312 | 4/1996 | Donzier et al. | 73/706 |
| 5,515,732 | 5/1996 | Willcox et al. | 73/724 |
| 5,539,236 | 7/1996 | Kurtz et al. | 257/415 |
| 5,684,253 | 11/1997 | Bonne et al. | 73/706 |
| 5,859,759 | 1/1999 | Moriyama et al. | 361/283.4 |

RIGID ENCAPSULATION PACKAGE FOR SEMICONDUCTOR DEVICES

BACKGROUND OF THE INVENTION

1. Field of the Invention

The present invention relates generally to the packaging of semiconductor sensors, actuators, and devices, and specifically, to packaging of semiconductor pressure sensors.

2. Background Information

Conventional semiconductor devices are packaged using a variety of methods including low cost, injection molding of plastic around the semiconductor die and leadframe. Certain types of semiconductor devices such as pressure sensors, actuators, and stress-sensitive electronic circuits typically cannot be injection molded in the conventional approach without degrading or impairing device operation. Semiconductor pressure sensors based on deformable diaphragms, for example, will typically shift in output signal, sensitivity, non-linearity, and hysteresis if not adequately isolated from contact with rigid materials.

Due to high stress sensitivity of the sensors, one method involves attaching a sensor die to a back plate having a closely matched thermal coefficient of expansion (e.g., Pyrex, silicon, or glass), which is then attached to a substrate. Typically, the substrate used is ceramic, PCB, plastic, or a metal header. Depending on the application and degree of accuracy required, the sensor die is attached to the substrate with soft epoxies or RTVs. The soft die attach material acts as a stress isolation mechanism, dampening the transfer of external stresses to the sensor die. The sensor package is housed in a protective enclosure in an effort to eliminate any physical contact with the sensor die itself (other than the measured media). This has typically resulted in a more complicated packaging and manufacturing process for the sensor. Although silicon sensors are similar to integrated circuits, sensor manufacturers have not been as successful, from a cost and reliability standpoint, in utilizing the advances in semiconductor packaging and manufacturing.

Figure 1:
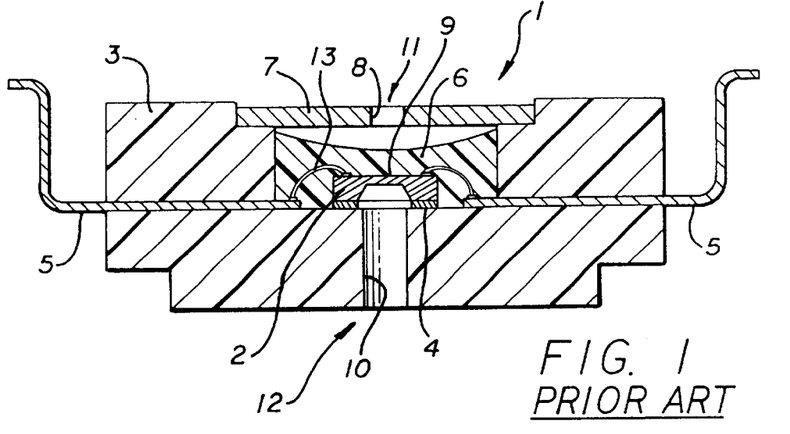
FIG. 1 illustrates a cross-sectional view of a prior-art semiconductor pressure sensor.

FIG. 1 illustrates a cross-sectional view of a prior-art semiconductor pressure sensor 1 housed in a plastic package 3. The pressure sensor 1 includes a semiconductor sensor die 2 having a thin, pressure-sensitive diaphragm 9 that is bonded to the bottom of the plastic package 3 using silicone RTV, as shown by numeral 4. The sensor die 2 typically contains a series of stress-sensitive resistors connected in a Wheatstone bridge configuration to provide a voltage output which varies with pressure applied across the diaphragm 9. Bond wires 13 are used to connect the stress-sensitive resistors to a leadframe 5, which is supported by the plastic package 3. A lid 7 is attached over the plastic package 3 and contains a hole 8 for the application of external pressure from a top side 11 of the pressure sensor 1. A second pressure port 10 may be optionally provided from a bottom side 12 of the sensor 1 for gage or differential pressure measurements.

The sensor die 2 is typically coated with a gel 6 to prevent direct environmental exposure and corrosion. The gel 6 is a compliant material, capable of transferring pressure to the diaphragm 9. Although at first, the semiconductor package seems like an elegant solution to the environmental exposure issue, the gel is not impervious to gases and liquids. That is, gases and liquids tend to penetrate the gel, corroding the underlying metal traces, bond pads, and wire bonds. Conventional integrated circuit packaging materials such as thermosetting plastics offer improved environmental protection, though they have historically been unsuitable for pressure sensors since they are rigid, non-compliant, thermally mismatched, and hysteretic, preventing cost-competitive packaging techniques to be utilized.

SUMMARY OF THE INVENTION

The present invention comprises a rigid encapsulation package for semiconductor sensors, actuators, and devices. The package includes a protective cap that is attached to a semiconductor die in which the cap and die are encapsulated with an injection-molded plastic. In one embodiment, the package is a semiconductor pressure sensor where the semiconductor die includes a deformable diaphragm, and the cap includes a recess. The cap is attached to the semiconductor die to form a cavity therebetween. The pressure sensor further includes a leadframe, one or more interconnecting bond wires, a pressure port that is coupled to the semiconductor die, and a nominally rigid material that is formed over the semiconductor die, cap, leadframe, and bond wires. The material may include one or more of the following: epoxy, RTV, resins, and gel. The semiconductor die may include a built-in stress isolation flexible region. A second pressure port may optionally be attached to the housing for providing differential or gage pressure measurements.

DETAILED DESCRIPTION

The present invention comprises a method and apparatus for packaging semiconductor sensors, actuators, and devices, allowing a semiconductor device to be attached directly to a metal leadframe (via e.g., epoxy, RTV, or solder). The semiconductor devices, such as pressure sensors, are then placed in standard transfer molding equipment used for integrated circuits ("ICs") to create a new generation of sensor packages that are fully encapsulated in a similar manner to ICs. This method of packaging allows for high volume, low-cost production of products (e.g., pressure sensors) that can serve many existing and emerging applications.

In one embodiment, the pressure sensor comprises a sensor die bonded to a cap, a stress-isolation mechanism, and at least one pressure port pathway for the communication of pressure from external sources. In addition, various over-molding methods are performed to produce high volume, low-cost packaging without undue degradation of the sensor performance.

Figures 2A, 2B:
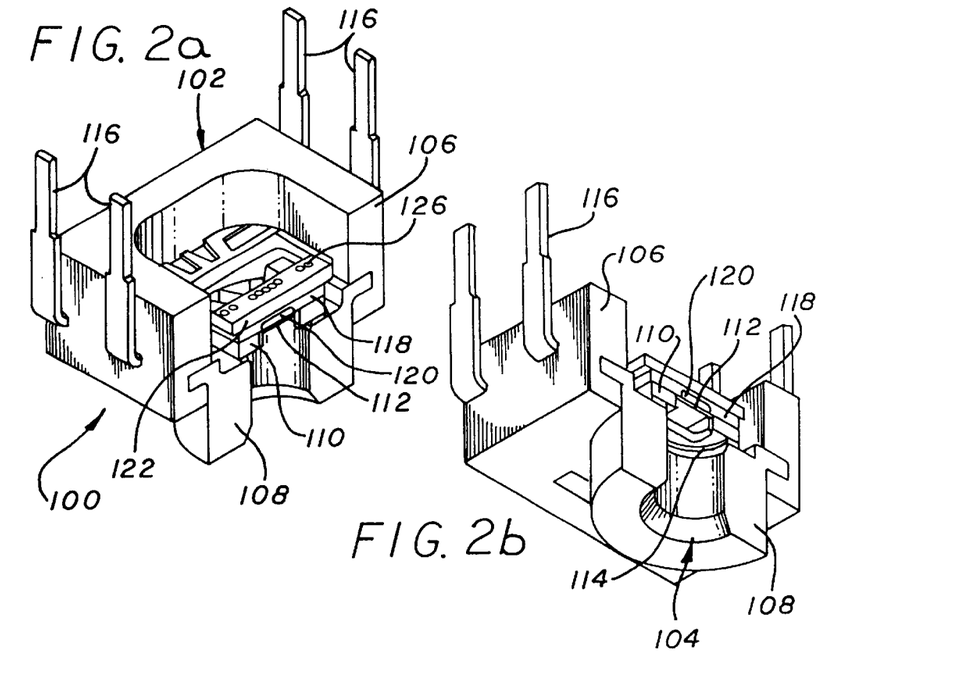
FIGS. 2a and 2b illustrate cut-away top and bottom views of a silicon pressure sensor according to one embodiment of the present invention.
Figure 3A:
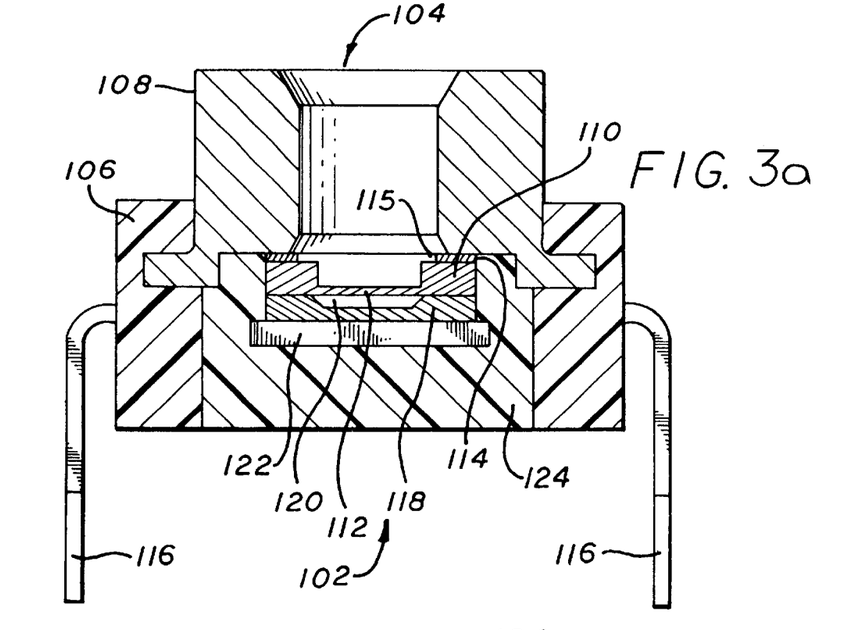
FIG. 3a illustrates a cross-sectional view of the silicon pressure sensor of FIGS. 2a and 2b where the pressure sensor capsule is also over-molded on the wire bonding side.

FIGS. 2a and 2b illustrate cut-away top and bottom views of a silicon pressure sensor 100 according to one embodiment of the present invention. FIG. 3a illustrates a cross-sectional view of the silicon pressure sensor 100. Referring to FIGS. 2a, 2b, and 3a, the silicon pressure sensor 100 has a top side 102 and a bottom side 104 which is exposed to pressure media (e.g., gas or fluid). The pressure sensor 100 comprises a molded plastic housing 106 which embodies a metal insert 108 (hereinafter referred to as a "pressure port").

In one embodiment, the housing 106 is made from diallylphthalate thermoset or liquid crystal polymer ("LCP") materials and the pressure port 108 is made from Invar 36, nickel plated kovar, brass or a combination of such materials, providing corrosion resistance and solderability. The metal pressure port 108 may be attached to connecting tubing using epoxy, solders, brazing, welding, or pressfitting. In another embodiment, the pressure port 108 is made out of plastic for attaching the pressure port to connecting tubing using epoxy, RTVs, adhesive, or pressfitting. The pressure port 108 may optionally be snapped into the plastic housing 106, in which case the pressure port may include an O-ring seal to prevent leakage (not shown). This allows the pressure port 108 to be configured into different shapes and sizes to maintain compatibility with different pressure interfaces.

The silicon pressure sensor 100 further comprises a sensor die 110 that includes a diaphragm 112. A plurality of piezoresistive elements is disposed on the diaphragm 112 and connected in a Wheatstone bridge configuration for sensing external pressure. The pressure port 108 provides a hermetic path for fluids to a backside 115 of the sensor die 110. A preform solder washer 114, is provided for soldering and hermetically attaching the sensor die 110 directly to the pressure port 108. In one embodiment, the preform solder washer 114 contains a combination of tin and silver, and preferably 96.5% tin and 3.5% silver having a eutectic melting point of 210° C. In another embodiment, the preform solder washer 114 contains a combination of gold and tin, and preferably 80% gold and 20% tin having a eutectic reflow temperature of 280° C. The backside 115 of the sensor die 110 may optionally be metallized with chromium and platinum for enhancing solderability and providing protection against exposure to fluids. The molded plastic housing 106 also embodies a metal leadframe 116 for externally interconnecting the circuitry contained within the silicon pressure sensor 100. In one embodiment, the metal leadframe 116 is made from Alloy 42 having electroless nickel and gold plating.

The sensor die 110 is bonded to a silicon or glass cap wafer 118 having a recess which forms a cavity 120 therebetween for allowing the diaphragm 112 to deflect responsive to applied stress, and for providing a vacuum pressure reference. In particular, the sensor die 110 is bonded to the cap 118 in a region around the diaphragm 112 to prevent penetration of the cavity by over-molding or injection molding material. The cap 118 may be optionally bonded to active electronic circuitry 122 (e.g., an application specific integrated circuit "ASIC") which provides amplification and signal correction. An exemplary active electronic circuitry includes electronically trimmable circuitry which negates the need for laser trimming. The active electronic circuitry 122 includes one or more pads 126 (FIG. 2a) for connecting the active electronic circuitry to the leadframe 116. A conformal epoxy coating 124 (e.g., RTV material) is applied to the topside 102 of the sensor for completing the sensor and protecting the electronics contained therein.

Figure 3B:
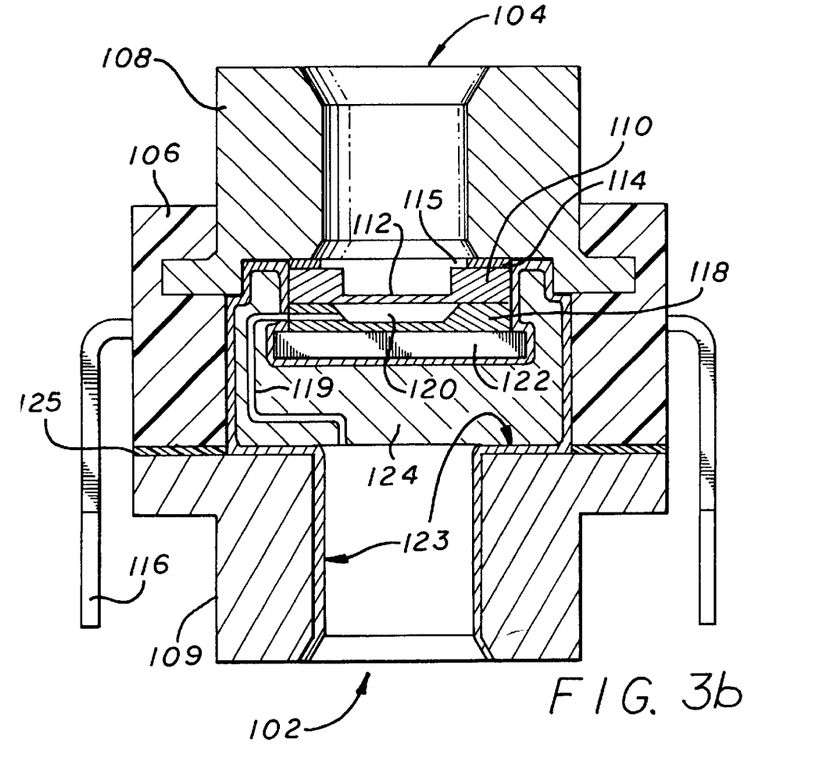
FIG. 3b illustrates a cross-sectional view of a silicon pressure sensor according to another embodiment of the present invention.

FIG. 3b illustrates a cross-sectional view of a silicon pressure sensor according to another embodiment of the present invention. As shown therein, a second pressure port 109 is attached to the housing 106 (e.g., with RTV, epoxy, etc.) as shown by numeral 125. In this embodiment, a passageway 119 is provided from the cavity 120, through the cap 118 and encapsulant 124, and to the second pressure port 109 for providing differential or gage pressure measurements. Prior to applying the encapsulant 124, a thin film coating 123 such as Teflon, silicon nitride, silicon carbide, diamond-like films, gold, nickel, parylene, or gel may be optionally deposited on the internal surfaces exposed to the pressure media for additional protection. The coating 123 may also be deposited on the inside of the second pressure port 109. The pressure ports 108 and 109 may be configured with various fittings, such as screw threads or barbed ends for connecting tubing.

Figures 4, 5A:
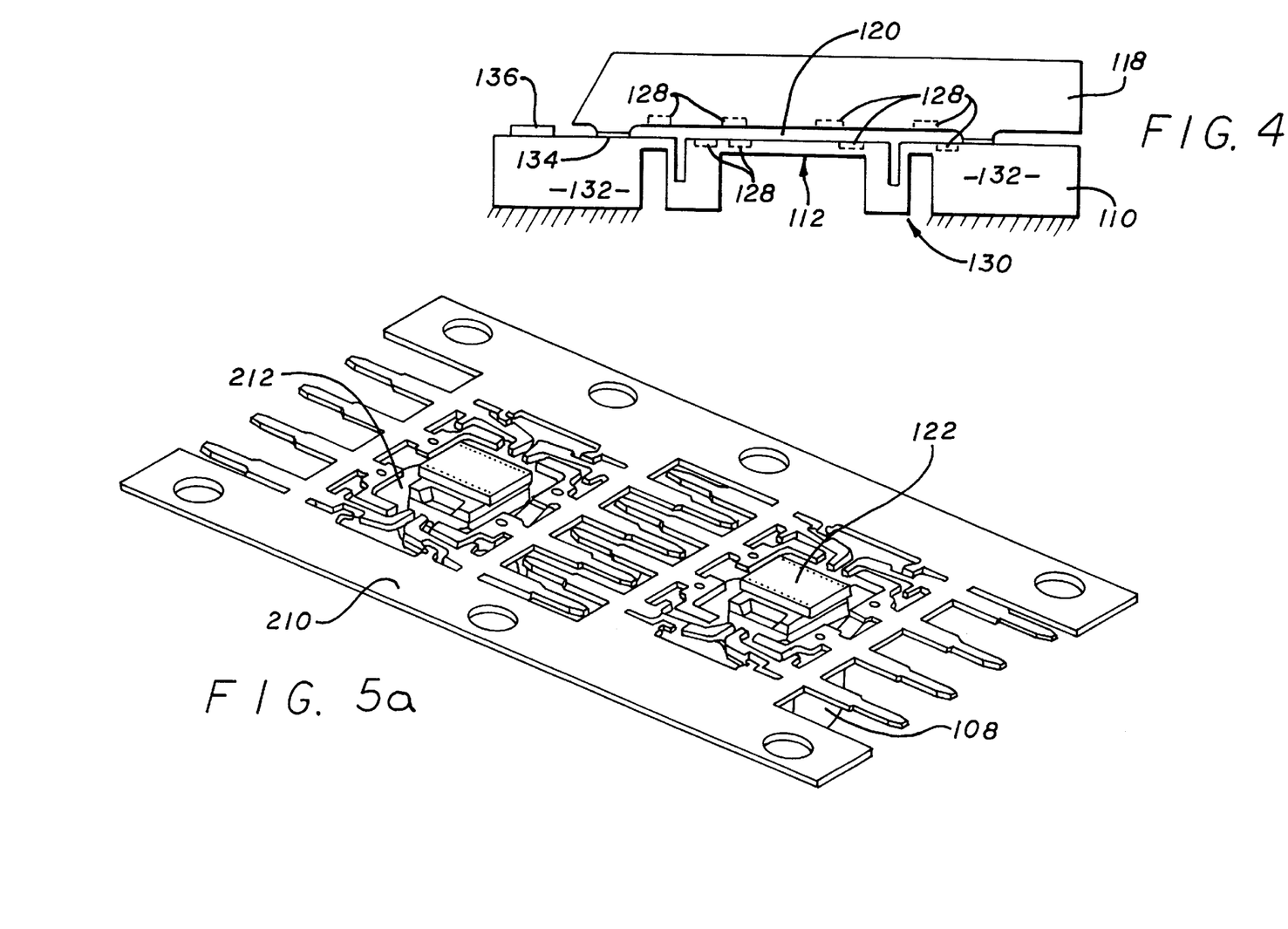
FIG. 4 illustrates a schematic cross section of the sensor die bonded to the silicon cap according to a preferred embodiment of the present invention.
FIG. 5a illustrates a metal leadframe strip having sensor elements attached directly thereto according to one embodiment of the present invention.

FIG. 4 illustrates a schematic cross section of a stress isolated sensor die 110 bonded to the cap 118 according to a preferred embodiment of the present invention. As shown in FIG. 4, the sensor die 110 includes the diaphragm 112 and an integral stress isolation flexible region 130. The stress isolation region 130 protects and isolates the diaphragm 112 from thermal, molding, and mounting stresses in the peripheral (or frame) region 132 of the sensor die 110. The flexible diaphragm 112 includes piezoresistors for sensing bending stresses from pressure applied to the diaphragm 112. A bond ring 134 is used to hermetically attach the cap 118 to the sensor die 110 and form a vacuum cavity 120 therebetween for providing an absolute pressure reference. By way of illustration, the bond ring 134, comprising aluminum, gold, or polysilicon, may be formed on the sensor die 110, while the cap 118 may be coated with germanium, uncoated, or gold coated, respectively. The bond is formed at the wafer level by placing the two wafers in physical contact under elevated temperature and pressure.

In addition to or in lieu of the active electronic circuitry 122 shown in FIG. 3a, active electronic circuitry may be fabricated inside the bond ring 134 of the sensor die 110 and the cap 118, as shown by dashed lines 128. Fabricating the electronic circuitry within the bond ring 134 environmentally protects the same from gaseous and/or fluid media. The cap 118 may contain a series of through-the-wafer etched holes for electrically connecting pads (not shown) on top of the cap 118 to circuitry on the sensor die 110. Active electronic circuitry may also be fabricated outside of the bond ring 134 (e.g., top side of cap 118).

FIG. 5a illustrates a metal leadframe strip 210 having one or more sensor capsules 212 attached directly thereto, according to one embodiment of the present invention. Referring to FIG. 5a, the sensor capsule 212 comprises the semiconductor die 110 bonded to the cap 118 (FIG. 3a). Additionally, pressure ports 108 may be attached to the leadframe strip 210, by an adhesive or may be welded thereto. The pressure port 108 is also attached to the sensor die 110 of the sensor capsule 212 (e.g., adhesive, solder, etc.). The ASIC 122 may also be attached to the cap 118 of the sensor capsule 212. The sensor die 110 and ASIC 122 are wire bonded (e.g., using gold ball bonding wires) to the leadframe strip 210 prior to performing a transfer molding operation.

The leadframe strip 210 is then placed in a transfer molding equipment where a thermoset compound is molded over the sensor capsule 212, ASIC 122, leadframe, and pressure port 108. The leads are trimmed to separate them electrically, allowing for on-strip testing and compensation. Finally, all tested and compensated units are separated from the leadframe strip 210 into individual units. Additionally, in order to provide further stress isolation from the molded compounds, a layer of silicone gel may be dispensed over the sensor capsule 212, and ASIC 122 prior to the transfer molding.

Figure 5B:
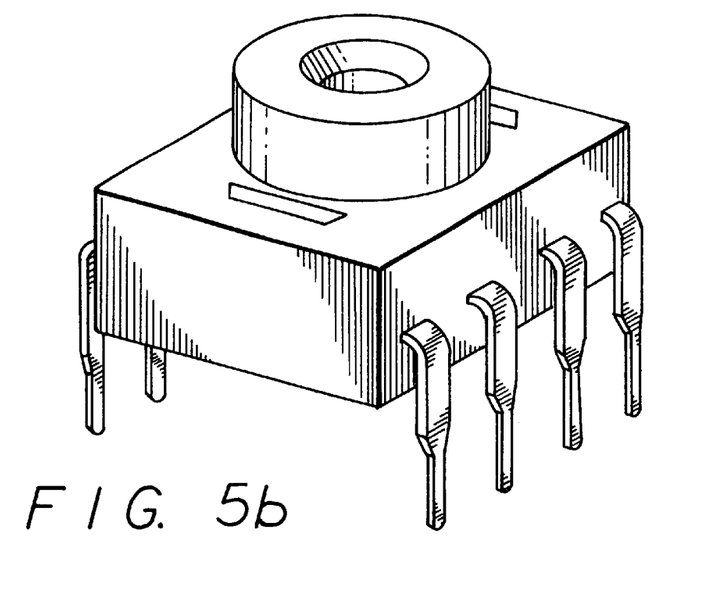
FIGS. 5b and 5c illustrate different configurations of the pressure sensor after transfer molding.
Figure 5C:
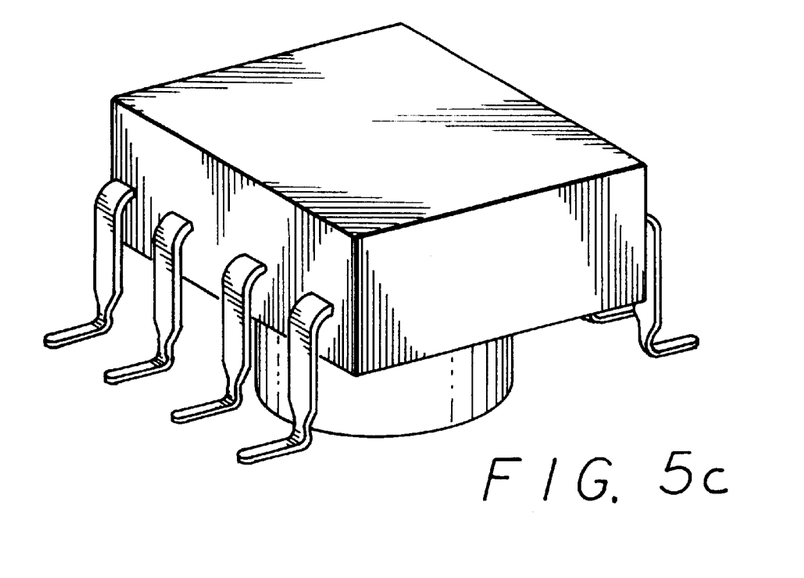
Figure 6A:
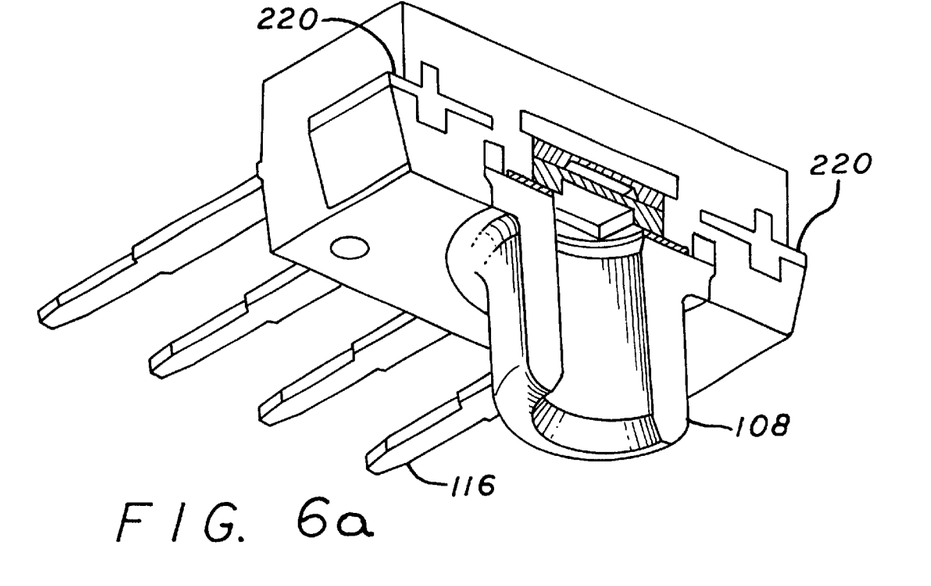
FIGS. 6a and 6b illustrate cross-sectional views of an over-molded pressure sensor, according to one embodiment of the present invention.
Figure 6B:
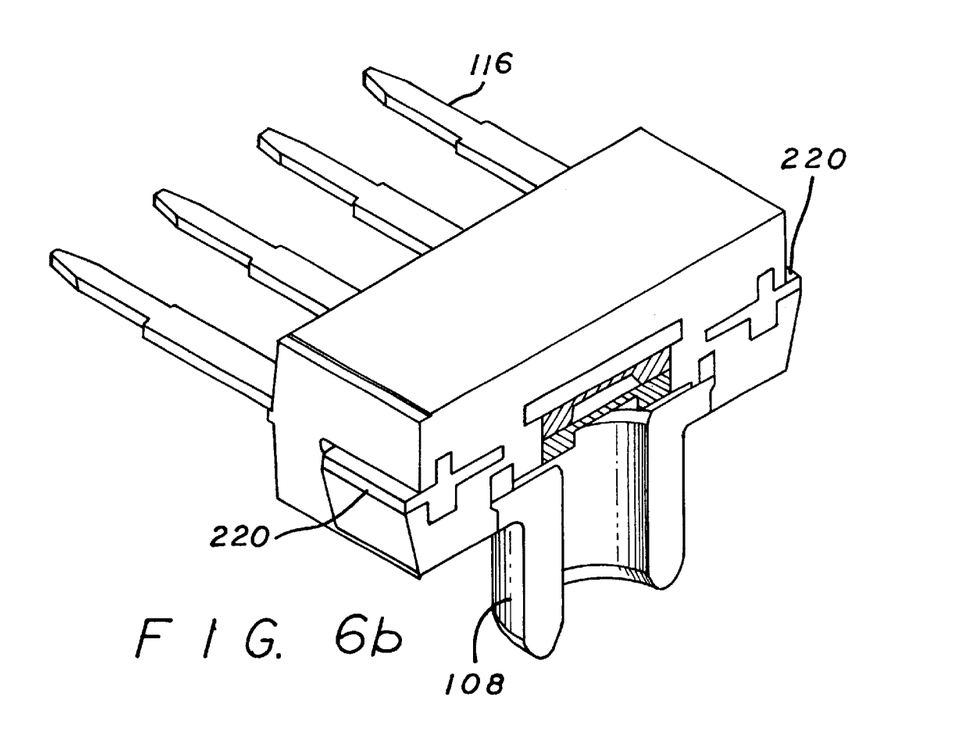

FIGS. 5*b* and 5*c* illustrate different configurations of the pressure sensor after transfer molding. In these embodiments, the pressure port 108, sensor capsule 212, compensation ASIC 122, and leadframe 116 (FIG. 3*a*) are all molded at the same time. The leads are configured in a dual-in-line package ("DIP") format (FIG. 5*b*) or as a surface mount technology ("SMT") format (FIG. 5*c*), though other configurations are possible. FIGS. 6*a* and 6*b* illustrate cross-sectional views of an over-molded pressure sensor, according to one embodiment of the present invention. In this embodiment, the packages incorporate mechanical snapping features 220 on two sides of the package to ease the attachment of the pressure port accessories and field installations (e.g., for attaching to various interfaces).

Figure 7A:
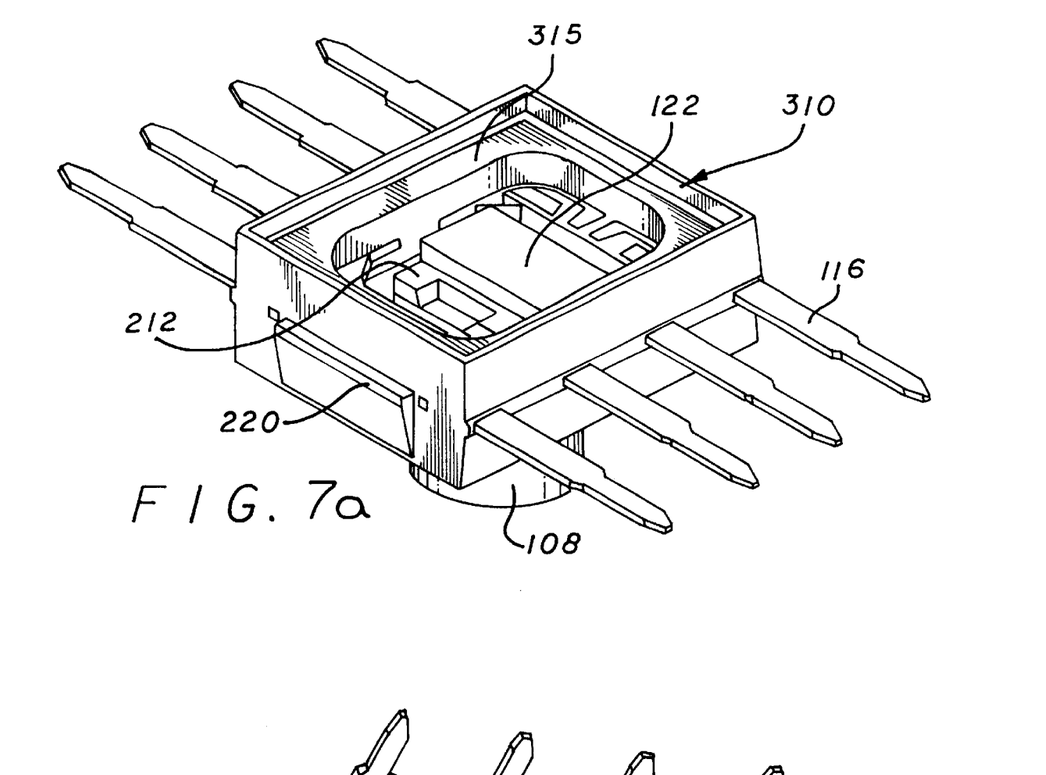
FIGS. 7a and 7b illustrate perspective views of a pre-molded leadframe package having a pressure port, according to another embodiment of the present invention.
Figure 7B:
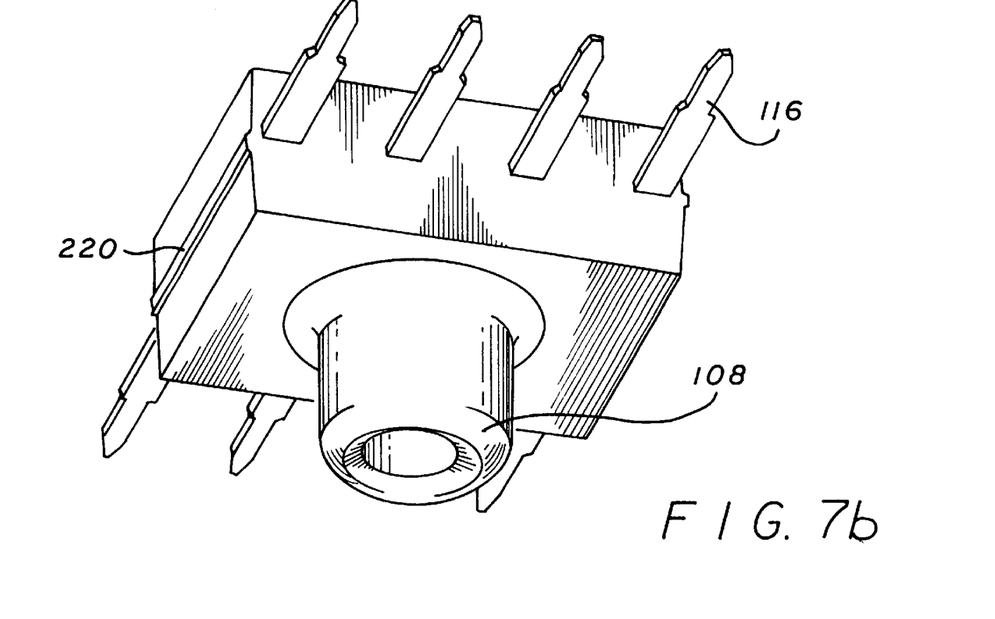

FIGS. 7*a* and 7*b* illustrate perspective views of a pre-molded leadframe package 310 having a pressure port, according to another embodiment of the present invention. In this embodiment, the sensor capsule 212 can be attached to a pre-molded package 310 before being encapsulated. The pre-molded leadframe package 310 comprises a metal leadframe 116 and a pressure port 108 which are molded together optionally with thermoset material or high temperature polymers such as LCP. This type of package typically has a cavity to allow for attachment of the sensor capsule 212 and bonding of the leadframe pads for electrical leadouts. After completion of the assembly, the top cavity 315 with the sensor capsule 212 and optional ASIC 122 can be encapsulated with a conformal material for full environmental and handling protections. This approach is a more robust solution than today's state-of-the-art solutions due to elimination of any need for silicone gel and the ability to apply pressure from the bottom.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. A semiconductor device package, comprising:
   a semiconductor die including a deformable diaphragm;
   a protective cap having a recess, the cap attached to the semiconductor die to form a cavity between the semiconductor die and the cap;
   a pressure port coupled to the semiconductor die;
   a leadframe;
   one or more bond wires connected to the leadframe; and
   a nominally rigid material formed over the semiconductor die, cap, leadframe, and bond wires.

2. The semiconductor device package of claim 1, wherein the semiconductor die includes a stress isolation flexible region.

3. The semiconductor device package of claim 1, wherein one or more piezoresistors are located on the diaphragm for measurement of pressure applied thereto.

4. The semiconductor device package of claim 1, wherein the cavity formed between the semiconductor die and the cap contains a vacuum for measurement of absolute pressure.

5. The semiconductor device package of claim 1 wherein the cap is a silicon cap.

6. The semiconductor device package of claim 1 wherein the cap is a glass cap.

7. The semiconductor device package of claim 1 further comprising a second pressure port coupled to the housing.

8. The semiconductor device package of claim 1 wherein the pressure port is made out of metal.

9. The semiconductor device package of claim 1 wherein the pressure port is made out of plastic.

10. The semiconductor device package of claim 1 wherein the pressure port accommodates an o-ring seal.

11. The semiconductor device package of claim 1 wherein the housing includes a snapping element for snapping the housing onto an interface.

12. The semiconductor device package of claim 1 further comprising an electronic circuit attached to the cap.

13. The semiconductor device package of claim 1 wherein the semiconductor die and cap are pre-coated with a silicone gel material prior to forming the nominally rigid material over the semiconductor die and cap.

14. The semiconductor device package of claim 2 wherein the stress isolation flexible region includes:
   a first member including a first end coupled to a frame region of the semiconductor die, and a second end; and
   a second member including a first end coupled to the second end of the first member, and a second end coupled to a rim region of the semiconductor die.

15. The semiconductor device package of claim 7 wherein a passageway is provided from the cavity, through the cap and material, and to the second pressure port for providing differential or gage pressure measurements.

16. An injection molded semiconductor pressure sensor, comprising:
   a sensor capsule including a semiconductor die having a deformable diaphragm, and a cap having a recess, the cap being attached to the semiconductor die to form a cavity therebetween;
   a pressure port coupled to the sensor capsule;
   a leadframe;
   one or more interconnecting bond wires for electrically connecting the sensor capsule to the leadframe;
   an injection molded package for housing the sensor capsule, pressure port, and leadframe; and
   a nominally rigid material formed over the sensor capsule, leadframe, and interconnecting bond wires.

17. The pressure sensor of claim 16 wherein the package is formed in a transfer molding operation by one of the following materials: thermoset and LCP.

18. The pressure sensor of claim 16 wherein the material formed over the sensor capsule includes one or more of the following: epoxy, RTV, resins, and gel.

19. The pressure sensor of claim 16 wherein the semiconductor die includes a built-in stress isolation flexible region.

20. The pressure sensor of claim 16 further comprising one or more piezoresistors located on the diaphragm for the measurement of pressure applied thereto.

21. The pressure sensor of claim 16 wherein the cavity includes a vacuum for the measurement of absolute pressure.

22. The pressure sensor of claim 16 further comprising an electronic circuit attached to the cap.

23. The pressure sensor of claim 16 further comprising a second pressure port attached to the package for providing differential or gage pressure measurements.

24. The pressure sensor of claim 16 wherein a protective coating is provided over the sensor capsule.

25. The pressure sensor of claim 16 wherein the sensor capsule is pre-coated with a compliant material.

26. The pressure sensor of claim 16 wherein the sensor capsule includes a signal compensation circuit incorporated thereon.

27. The pressure sensor of claim 19 wherein the stress isolation flexible region includes:

a first member including a first end coupled to a frame region of the semiconductor die, and a second end; and a second member including a first end coupled to the second end of the first member, and a second end coupled to a rim region of the semiconductor die.

28. An apparatus, comprising:

a leadframe strip; and one or more semiconductor pressure sensors attached to the leadframe strip, each pressure sensor including, a sensor capsule including a semiconductor die having a deformable diaphragm, and a cap having a recess, the cap being attached to the semiconductor die to form a cavity therebetween, and a pressure port coupled to the sensor capsule and the leadframe strip.

29. The apparatus of claim 28 wherein each pressure sensor further includes, an injection molded package for housing the sensor capsule and the pressure port; and a material formed over the sensor capsule.

30. The apparatus of claim 28 wherein the leadframe strip is configured with interleaved leads to allow on-strip testing and signal compensation.

31. A semiconductor device package, comprising:

a semiconductor die with a stress isolation flexible region including a first member including a first end coupled to a frame region of the semiconductor die, and a second end, and a second member including a first end coupled to the second end of the first member, and a second end coupled to a rim region of the semiconductor die;

a protective cap attached to the semiconductor die;

a leadframe;

one or more bond wires connected to the leadframe; and a nominally rigid material formed over the semiconductor die, cap, leadframe, and bond wires.

32. The semiconductor device package claim 31, wherein the semiconductor die includes a deformable diaphragm and the cap includes a recess, the cap being attached to the semiconductor die to form a cavity therebetween, the semiconductor device package further including a pressure port coupled to the semiconductor die.

33. The semiconductor device package of claim 31 wherein the cap is a silicon cap.

34. The semiconductor device package of claim 31 wherein the cap is a glass cap.

35. The semiconductor device package of claim 31 further comprising an electronic circuit attached to the cap.

36. The semiconductor device package of claim 31 wherein the semiconductor die and cap are pre-coated with a silicone gel material prior to forming the nominally rigid material over the semiconductor die and cap.

37. The semiconductor device package of claim 32, wherein one or more piezoresistors are located on the diaphragm for measurement of pressure applied thereto.

38. The semiconductor device package of claim 32, wherein the cavity formed between the semiconductor die and the cap contains a vacuum for measurement of absolute pressure.

39. The semiconductor device package of claim 32 further comprising a second pressure port coupled to the housing.

40. The semiconductor device package of claim 32 wherein the pressure port is made out of metal.

41. The semiconductor device package of claim 32 wherein the pressure port is made out of plastic.

42. The semiconductor device package of claim 32 wherein the pressure port accommodates an o-ring seal.

43. The semiconductor device package of claim 32 wherein the housing includes a snapping element for snapping the housing onto an interface.

44. The semiconductor device package of claim 39 wherein a passageway is provided from the cavity, through the cap and material, and to the second pressure port for providing differential or gage pressure measurements.

* * * * *